United States Patent [19]
Nilssen

[11] Patent Number: 5,446,346
[45] Date of Patent: Aug. 29, 1995

[54] ELECTRONIC BALLAST WITH CONTROLLED DC SUPPLY VOLTAGE

[76] Inventor: Ole K. Nilssen, 408 Caesar Dr., Barrington, Ill. 60010

[21] Appl. No.: 846,014

[22] Filed: Mar. 4, 1992

Related U.S. Application Data

[63] Continuation-in-part of Ser. No. 734,188, Jul. 22, 1991, which is a continuation-in-part of Ser. No. 643,023, Jan. 18, 1991, which is a continuation-in-part of Ser. No. 787,692, Oct. 15, 1985, abandoned, which is a continuation of Ser. No. 644,155, Aug. 27, 1984, abandoned, which is a continuation of Ser. No. 555,426, Nov. 23, 1983, abandoned, which is a continuation of Ser. No. 178,107, Aug. 14, 1980, abandoned, which is a continuation-in-part of Ser. No. 973,741, Dec. 28, 1978, abandoned, which is a continuation-in-part of Ser. No. 890,586, Mar. 20, 1978, Pat. No. 4,184,128.

[51] Int. Cl.$^6$ .............................................. H05B 41/36
[52] U.S. Cl. .................... 315/209 R; 315/219; 315/DIG. 7
[58] Field of Search ............ 315/209 R, 219, DIG. 7, 315/DIG. 4, DIG. 5, 220, 240, 224, 276, 278, 279, 307, 72; 331/113 A, 53

[56] References Cited

U.S. PATENT DOCUMENTS

| | | | |
|---|---|---|---|
| 3,026,486 | 3/1962 | Pintell | 331/117 |
| 4,266,134 | 5/1981 | Franke et al. | 250/409 |
| 4,677,345 | 6/1987 | Nilssen | 315/209 R |

OTHER PUBLICATIONS

Bedford et al, Princeples of Inventer Circuits, John Wiley & Sons, Inc 1964, pp. 287-300.

Primary Examiner—Ali Neyzari

[57] ABSTRACT

In an electronic ballast, a half-bridge inverter is powered from a DC voltage and provides an AC output voltage having a waveform with trapezoidally shaped half-cycles. The DC voltage is obtained by way of a pre-converter with a control input operative to permit control of the magnitude of the DC voltage. The AC voltage is applied across the primary winding of a leakage transformer, whose loosely coupled secondary winding is connected across a gas discharge lamp. The internal inductive reactance of the secondary winding constitutes a lamp ballasting means by way of limiting the magnitude of the resulting lamp current to a desired level. Prior to the flow of lamp current, the magnitude of the DC voltage is controlled by negative feedback to the control input so as to remain at a maximum level. After lamp current has started to flow, by negative feedback derived from the lamp current itself, the magnitude of the DC voltage is reduced so as to bring the magnitude of the lamp current down to the desired level.

20 Claims, 7 Drawing Sheets

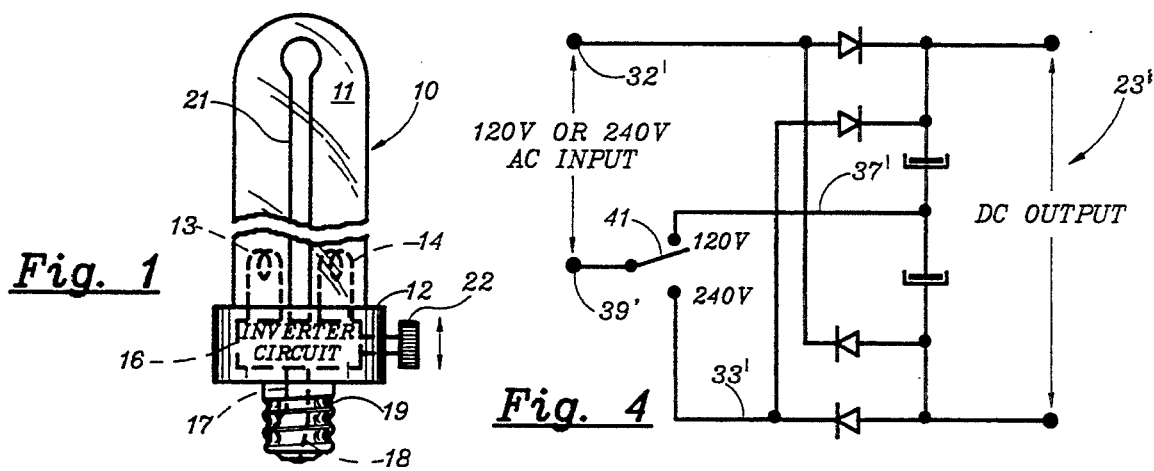
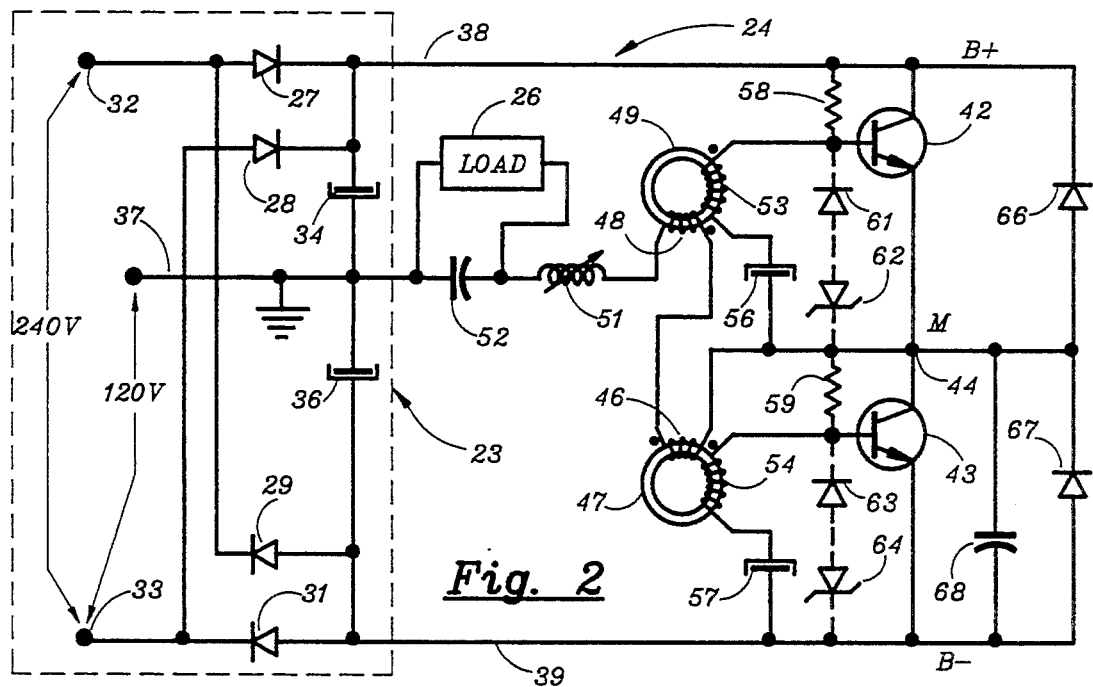
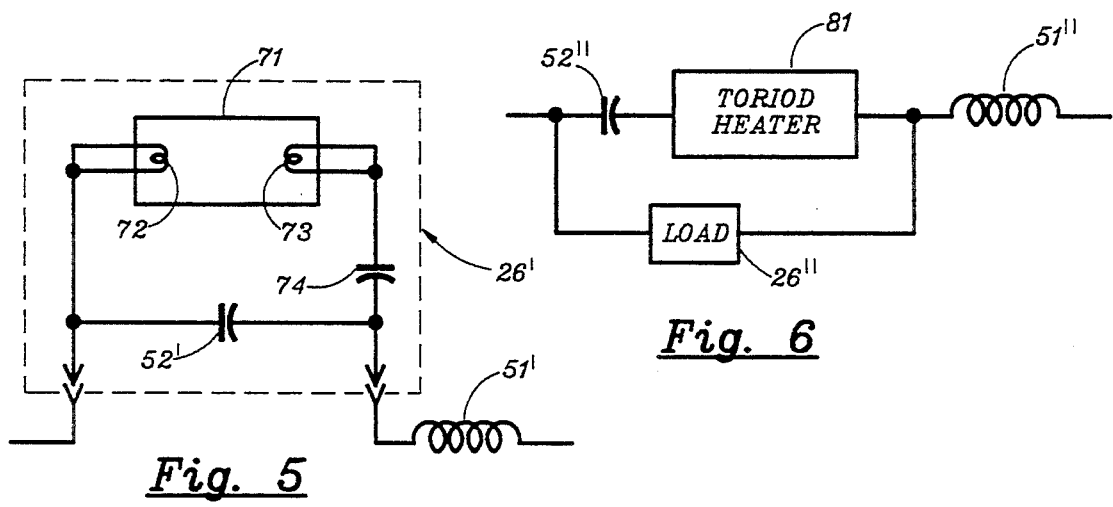

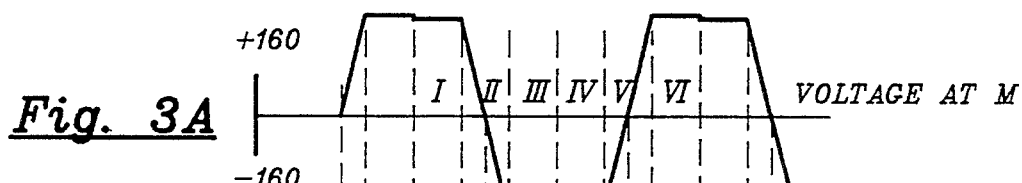
*Fig. 3A*    VOLTAGE AT M
*Fig. 3B*    BASE VOLTAGE
*Fig. 3C*    TRANSISTOR CURRENT
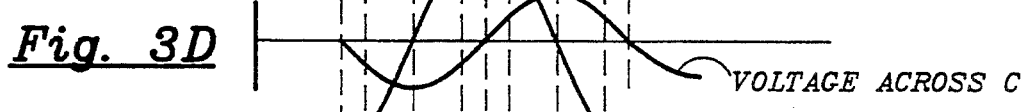
*Fig. 3D*    CURRENT THROUGH L / VOLTAGE ACROSS C
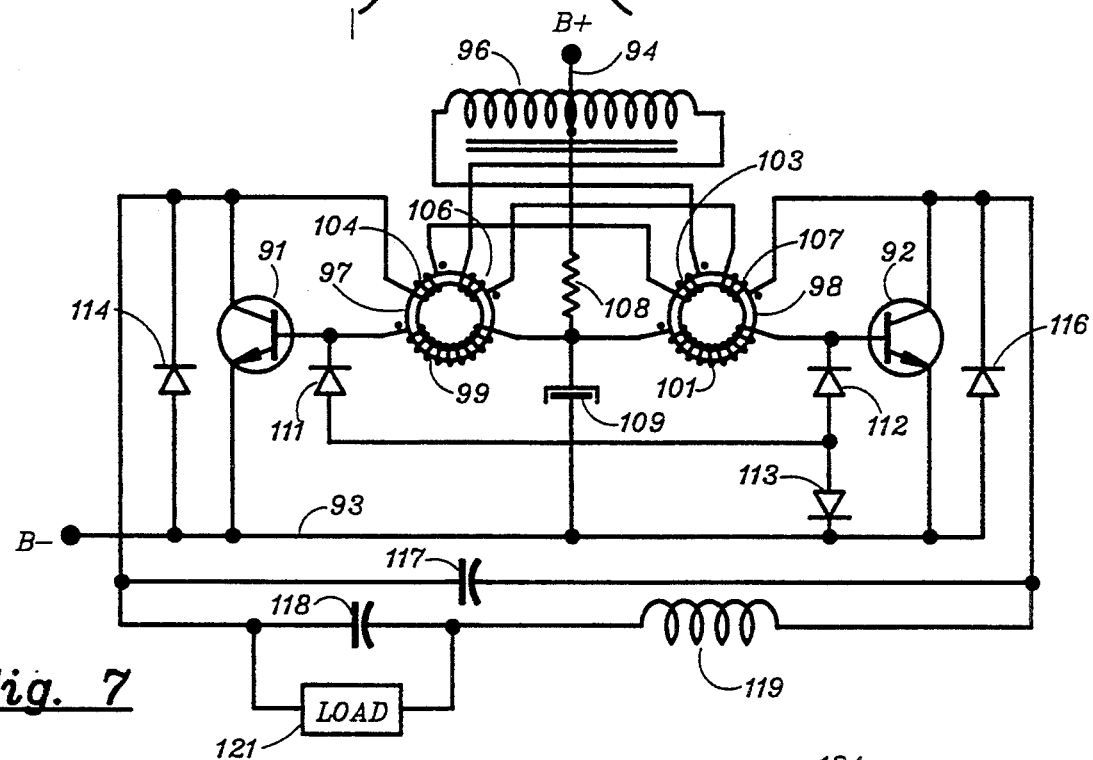
*Fig. 7*
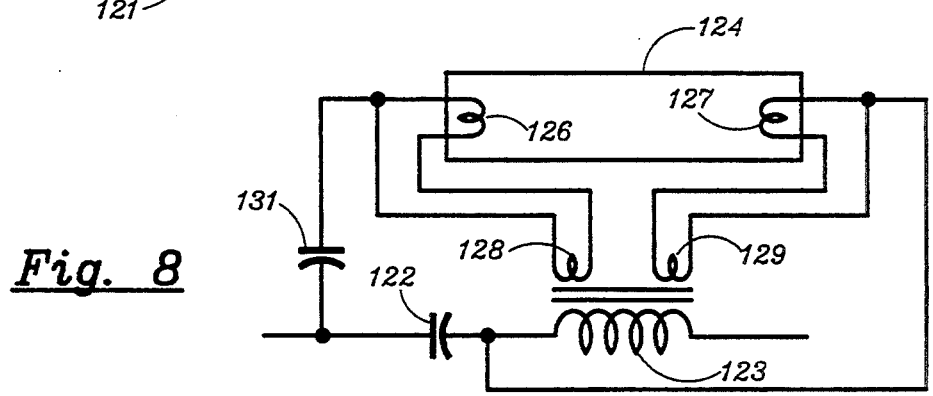
*Fig. 8*

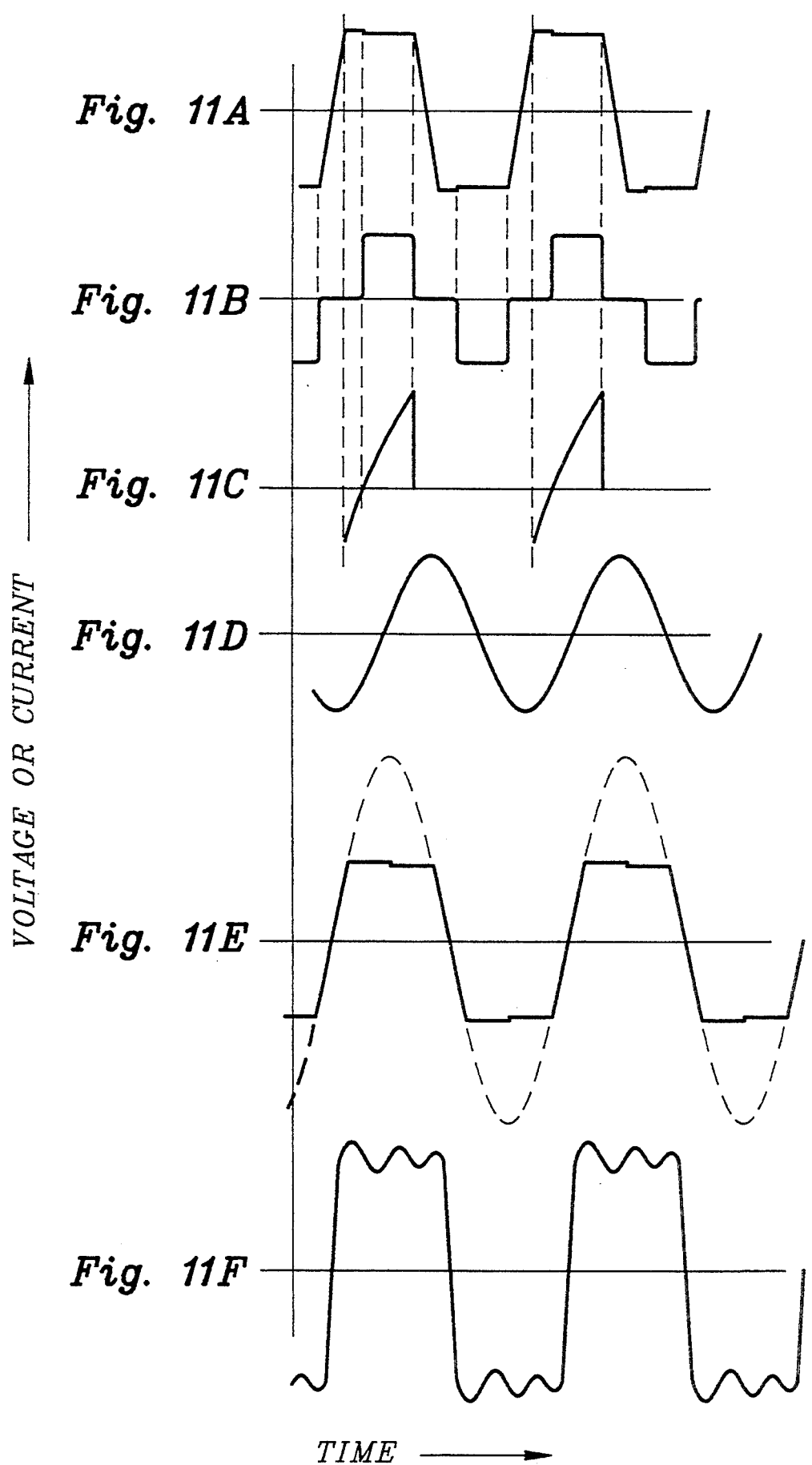

ELECTRONIC BALLAST WITH CONTROLLED DC SUPPLY VOLTAGE

RELATED APPLICATIONS

The present application is a Continuation-in-Part of Ser. No. 07/734/188 filed Jul. 22, 1991; which is a Continuation-in-Part of Ser. No. 07/643,023 filed Jan. 18, 1991; which is a Continuation-in-Part of Ser. No. 06/787,692 filed Oct. 15, 1985, now abandoned; which is a Continuation of Ser. No. Jun. 06/644,155 filed Aug. 27, 1984, now abandoned; which is a Continuation of Ser. No. 06/555,426 filed Nov. 23, 1983, now abandoned; which is a Continuation of Serial No. 06/178,107 filed Aug. 14, 1980, now abandoned; which is a Continuation-in-Part of Ser. No. 05/973,741 filed Dec. 28, 1978, now abandoned; which is a Continuation-in-Part of Ser. No. 05/890,586 filed Mar. 20, 1978, now U.S. Pat. No. 4,184,128.

BACKGROUND OF THE INVENTION

1. Field of Invention

This invention relates to electronic ballasts for gas discharge lamps, particularly to electronic ballasts having a pre-converter for establishing a controlled DC supply voltage.

2. Description of Prior Art

For a description of pertinent prior art, reference is made to U.S. Pat. No. 4,677,345 to Nilssen; which patent issued from a Division of application Ser. No. 06/178,107 filed Aug. 14, 1980; which application is the original in-part progenitor of instant application.

Otherwise, reference is made to the following U.S. Pat. Nos.: 3,263,122 to Genuit; 3,320,510 to Locklair; 3,996,493 to Davenport et el.; 4,100,476 to Ghiringhelli; 4,262,327 to Kovacik et al.; 4,370,600 to Zansky; 4,634,932 to Nilssen; and 4,857,806 to Nilssen.

SUMMARY OF THE INVENTION

Objects of the Invention

A main object of the present invention is that of providing a cost-effective ballasting means for gas discharge lamps.

This as well as other objects, features and advantages of the present invention will become apparent from the following description and claims.

BRIEF DESCRIPTION OF THE INVENTION

In an electronic ballast, a half-bridge inverter is powered from a DC voltage and provides an AC output voltage having a waveform with trapezoidally shaped half-cycles. The DC voltage is obtained by way of a pre-converter with a control input operative to permit control of the magnitude of the DC voltage. The AC voltage is applied across the primary winding of a leakage transformer, whose loosely coupled secondary winding is connected across a gas discharge lamp. The internal inductive reactance of the secondary winding constitutes a lamp ballasting means by way of limiting the magnitude of the resulting lamp current to a desired level.

Prior to the flow of lamp current, the magnitude of the DC voltage is controlled by negative feedback to the control input so as to remain at a pre-determined maximum level. After lamp current has started to flow, by negative feedback derived from the lamp current by way of a current-transformer, the magnitude of the DC voltage is reduced so as to bring the magnitude of the lamp current down to the desired level.

That is, prior to lamp ignition, the pre-converter is controlled—by way of threshold-limited negative feedback—so as to maintain the magnitude of the DC supply voltage at a given level. After lamp ignition, the pre-converter is controlled —by way of negative feedback derived from the lamp current itself—so as to reduce the magnitude of the DC supply voltage, thereby to reduce the magnitude of the lamp current to a desired level. Without feedback of the lamp current to the control input of the pre-converter the magnitude of the lamp current would have been higher than the desired level. dr

BRIEF DESCRIPTION OF THE DRAWINGS

FIG. 1 is a front elevation of a folded fluorescent lamp unit adapted for screw-in insertion into a standard Edison incandescent socket;

FIG. 2 is a schematic diagram illustrating the essential features of a push-pull inverter circuit particularly suitable for energizing the lamp unit of FIG. 1;

FIG. 3A–3D is a set of waveform diagrams of certain significant voltages and currents occurring in the circuit of FIG. 2;

FIG. 4 is a schematic diagram of a DC power supply connectable to both 120 and 240 volt AC inputs;

FIG. 5 is a schematic diagram which illustrates the connection of a non-self-ballasted gas discharge lamp unit to the FIG. 2 inverter circuit;

FIG. 6 is a schematic diagram which illustrates the use of a toroid heater for regulation of the inverter frequency and thereby its output;

FIG. 7 is an alternate form of push-pull inverter circuit according to the present invention;

FIG. 8 is a schematic diagram showing the connection of a gas discharge lamp of the "rapid-start" type to an inductor-capacitor-loaded inverter according to the present invention;

FIG. 11A–11H show various voltage and current waveforms associated with the circuit arrangement of FIG. 9.

DESCRIPTION OF VARIOUS PREFERRED ELECTRONIC BALLASTS

Figure 10:
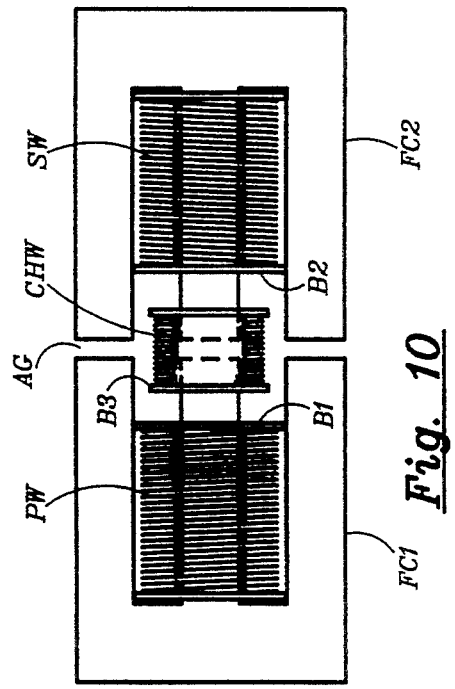
FIG. 10 is a schematic illustration of the leakage transformer used in the circuit arrangement of FIG. 9.

FIG. 1 illustrates a screw-in gas discharge lamp unit 10 comprising a folded fluorescent lamp 11 suitably secured to an integral base 12. The lamp comprises two cathodes 13, 14 which are supplied with the requisite high operating voltage from a frequency-converting power supply and ballasting circuit 16; which, because of its compact size, conveniently fits within the base 12.

The inverter circuit 16 is connected by leads 17, 18 to a screw-type plug 19 adapted for screw-in insertion into a standard Edison-type incandescent lamp socket at which ordinary 120 Volt/60 Hz power line voltage is available. A ground plane comprising a wire or metallic strip 21 is disposed adjacent a portion of the fluorescent lamp 11 as a starting aid.

Finally, a manually rotatable external knob 22 is connected to a shaft for mechanical adjustment of the air gap of a ferrite core inductor to vary the inductance value thereof in order to effect adjustment of the inverter voltage output connected to electrodes 13, 14 for controlled variation of the lamp illumination intensity.

With reference to FIG. 2, a power supply 23, connected to a conventional AC input, provides a DC output for supplying a high-efficiency inverter circuit 24. The inverter is operable to provide a high voltage to an external load 26, which may comprise a gas discharge device such as the fluorescent lamp 11 of FIG. 1.

The power supply 23 comprises bridge rectifier having four diodes 27, 28, 29 and 31 connectable to a 240 volt AC supply at terminals 32, 33. Capacitors 34, 36 are connected between a ground line 37 (in turn directly connected to the inverter 24) and to a B+ line 38 and a B− line 39, respectively. The power supply 23 also comprises a voltage doubler and rectifier optionally connectable to a 120 volt AC input taken between the ground line 37 and terminal 33 or 32. The voltage doubler and rectifier means provides a direct electrical connection by way of line 37 between one of the 120 volt AC power input lines and the inverter 24, as shown in FIG. 2. The bridge rectifier and the voltage doubler and rectifier provide substantially the same DC output voltage to the inverter 24 whether the AC input is 120 or 240 volts. Typical voltages are +160 volts on the B+ line 38 and −160 volts on the B− line 39.

With additional reference to FIG. 4, which shows an alternate power supply 23', the AC input, whether 120 or 240 volts, is provided at terminals 32' and 39. Terminal 39 is in turn connected through a single-pole double-throw selector switch 41 to terminal 37' (for 120 volt operation) or terminal 33' (for 240 volt operation). In all other respects, power supplies 23 and 23' are identical.

The inverter circuit 24 of FIG. 2 is a half-bridge inverter comprising transistors 42, 43 connected in series across the DC voltage output of the power supply 23 on B+ and B− lines 38 and 39, respectively. The collector of transistor 42 is connected to the B+ line 38, the emitter of transistor 42 and the collector of transistor 43 are connected to a midpoint line 44 (designated "M") and the emitter of transistor 43 is connected to the Bline 39. The midpoint line 44 is in turn connected to the ground line 37 through primary winding 46 of a toroidal saturable core transformer 47, a primary winding 48 on an identical transformer 49, an inductor 51 and a series-connected capacitor 52. The inductor 51 and capacitor 52 are energized upon alternate transistor conduction in a manner to be described later.

An external load 26 is preferably taken off capacitor 52, as shown in FIG. 2. The inductor 51, preferably a known ferrite core inductor, has an inductance variable by mechanical adjustment of the air gap in order to effect variation in the level of the inductor and capacitor voltage and hence the power available to the load, as will be described. When the load is a gas discharge lamp such as lamp 11 in FIG. 1, variation in this inductance upon rotation of knob 22 accomplishes a lamp dimming effect.

Drive current to the base terminals of transistors 42 and 43 is provided by secondary windings 53, 54 of transformers 49, 47, respectively. Winding 53 is also connected to midpoint lead 44 through a bias capacitor 56, while winding 54 is connected to the B− lead 39 through an identical bias capacitor 57. The base terminals of transistors 42 and 43 are also connected to lines 38 and 44 through bias resistors 58 and 59, respectively. For a purpose to be described later, the base of transistor 42 can be optionally connected to a diode 61 and a series Zener diode 62 in turn connected to the midpoint line 44; similarly, a diode 63 and series Zener diode 64 in turn connected to the B− line 39 can be connected to the base of transistor 43. Shunt diodes 66 and 67 are connected across the collector-emitter terminals of transistors 42 and 43, respectively. Finally, a capacitor 68 is connected across the collector-emitter terminals of transistor 43 to restrain the rate of voltage rise across those terminals, as will be seen presently.

The operation of the circuit of FIG. 2 can best be understood with additional reference to FIG. 3, which illustrates significant portions of the waveforms of the voltage at midpoint M (FIG. 3A), the base-emitter voltage on transistor 42 (FIG. 3B), the current through transistor 42 (FIG. 3C), and the capacitor 52 voltage and the inductor 51 current (FIG. 3D).

Assuming that transistor 42 is first to be triggered into conduction, current flows from the B+ line 38 through windings 46 and 48 and the inductor 51 to charge capacitor 52 and returns through capacitor 34 (refer to the time period designated I in FIG. 3). When the saturable inductor 49 saturates at the end of period I, drive current to the base of transistor 42 will terminate, causing voltage on the base of the transistor to drop to the negative voltage stored on the bias capacitor 56 in a manner to be described, causing this transistor to become nonconductive. As shown in FIG. 3c, current-flow in transistor 43 terminates at the end of period I.

Because the current through inductor 51 cannot change instantaneously, current will flow from the B− bus 39 through capacitor 68, causing the voltage at midpoint line 44 to drop to −160 volts (period II in FIG. 3). The capacitor 68 restrains the rate of voltage change across the collector and emitter terminals of transistor 42. The current through the inductor 51 reaches its maximum value when the voltage at the midpoint line 44 is zero. During period III, the current will continue to flow through inductor 51 but will be supplied from the B-bus through the shunt diode 67. It will be appreciated that during the latter half of period II and all of period III, positive current is being drawn from a negative voltage; which, in reality, means that energy is being returned to the power supply through a path of relatively low impedance.

When the inductor current reaches zero at the start of period IV, the current through the primary winding 46 of the saturable inductor 47 will cause a current to flow out of its secondary winding 54 to cause transistor 43 to become conductive; thereby causing a reversal in the direction of current through inductor 51 and capacitor 52. When transformer 47 saturates at the end of period IV, the drive current to the base of transistor 43 terminates and the current through inductor 51 will be supplied through capacitor 68, causing the voltage at midpoint line 44 to rise (period V). When the voltage at the midpoint line M reaches 160 volts, the current will then flow through shunt diode 66 (period VI). The cycle is then repeated.

As seen in FIG. 3, saturable transformers 47, 49 provide transistor drive current only after the current through inductor 51 has diminished to zero. Further, the transistor drive current is terminated before the current through inductor 51 has reached its maximum amplitude. This coordination of base drive current and inductor current is achieved because of the series-connection between the inductor 51 and the primary windings 46, 48 of saturable transformers 47, 49, respectively.

The series-connected combination of the inductor 51 and the capacitor 52 is energized upon the alternate conduction of transistors 42 and 43. With a large value of capacitance of capacitor 52, very little voltage will be developed across its terminals. As the value of this capacitance is decreased, however, the voltage across this capacitor will increase. As the value of the capacitor 52 is reduced to achieve resonance with the inductor 51, the voltage on the capacitor will rise and become infinite in a loss-free circuit operating under ideal conditions.

It has been found desirable to regulate the transistor inversion frequency, determined mainly by the saturation time of the saturable inductors 47, 49, to be equal to or higher than the natural resonance frequency of the inductor and capacitor combination in order to provide a high voltage output to external load 26. A high voltage across capacitor 52 is efficiently developed as the transistor inversion frequency approaches the natural resonant frequency of the inductor 51 and capacitor 52 combination. Stated another way, the conduction period of each transistor is desirably shorter in duration than one quarter of the full period corresponding to the natural resonant frequency of the inductor and capacitor combination. When the inverter 24 is used with a self-ballasted gas discharge lamp unit, it has been found that the inversion frequency can be at least equal to the natural resonant frequency of the tank circuit. If the capacitance value of capacitor 52 is reduced still further beyond the resonance point, unacceptably high transistor currents will be experienced during transistor switching and transistor burn-out will occur.

It will be appreciated that the sizing of capacitor 52 is determined by the application of the inverter circuit 24. Variation in the values of the capacitor 52 and the inductor 51 will determine the voltages developed in the inductor-capacitor tank circuit. The external load 26 may be connected in circuit with the inductor 51 (by a winding on the inductor, for example) and the capacitor may be omitted entirely. If the combined circuit loading of the inductor 51 and the external load 26 has an effective inductance of value sufficient to effect periodic energy storage for self-sustained transistor inversion, the current feedback provided by the saturable inductors 47,49 will effect alternate transistor conduction without the need for additional voltage feedback. When the capacitor 52 is omitted, the power supply 23 provides a direct electrical connection between one of the AC power input lines and the inverter load circuit.

Because the voltages across transistors 42, 43 are relatively low (due to the effect of capacitors 34, 36), the half-bridge inverter 24 is very reliable. The absence of switching transients minimizes the possibility of transistor burn-out.

The inverter circuit 24 comprises means for supplying reverse bias to the conducting transistor upon saturation of its associated saturable inductor. For this purpose, the capacitors 56 and 57 are charged to negative voltages as a result of reset current flowing into secondary windings 53, 54 from the bases of transistors 42, 43, respectively. This reverse current rapidly turns off a conducting transistor to increase its switching speed and to achieve inverter circuit efficiency in a manner described more fully in my co-pending U.S. patent application Ser. No. 103,624 filed Dec. 14, 1979 and entitled "Bias Control for High Efficiency Inverter Circuit" (now U.S. Pat. No. 4,307,353). The more negative the voltage on the bias capacitors 56 and 57, the more rapidly charges are swept out of the bases of their associated transistors upon transistor turn-off.

When a transistor base-emitter junction is reversely biased, it exhibits the characteristics of a Zener diode having a reverse breakdown voltage on the order of 8 to 14 Volt for transistors typically used in high-voltage inverters. As an alternative, to provide a negative voltage smaller in magnitude on the base lead of typical transistor 42 during reset operation, the optional diode 61 and Zener diode 62 combination can be used. For large values of the bias capacitor 56, the base voltage will be substantially constant.

If the load 26 comprises a gas discharge lamp, the voltage across the capacitor 52 will be reduced once the lamp is ignited to prevent voltages on the inductor 51 and the capacitor 52 from reaching destructive levels. Such a lamp provides an initial time delay during which a high voltage, suitable for instant starting, is available.

FIG. 5 illustrates the use of an alternate load 26' adapted for plug-in connection to an inverter circuit such as shown in FIG. 2. The load 26' consists of a gas discharge lamp 71 having electrodes 72, 73 and connected in series with a capacitor 74. The combination of lamp 71 and capacitor 74 is connected in parallel with a capacitor 52' which serves the same purpose as capacitor 52 in the FIG. 2 circuit. However, when the load 26' is unplugged from the circuit, the inverter stops oscillating and the development of high voltages in the inverter is prevented. The fact that no high voltages are generated by the circuit if the lamp is disconnected while the circuit is oscillating is important for safety reasons.

FIG. 6 illustrates a capacitor 52" connected in series with an inductor 51" through a heater 81 suitable for heating the toroidal inductors 47, 49 in accordance with the level of output. The load 26" is connected across the series combination of the capacitor 52" and the toroid heater. The heater 81 is preferably designed to controllably heat the toroidal saturable inductors in order to decrease their saturation flux limit and hence their saturation time. The result is to decrease the periodic transistor conduction time and thereby increase the transistor inversion frequency. When a frequency-dependent impedance means, that is, an inductor or a capacitor, is connected in circuit with the AC voltage output of the inverter, change in the transistor inversion frequency will modify the impedance of the frequency-dependent impedance means and correspondingly modify the inverter output. Thus as the level of the output increases, the toroid heater 81 is correspondingly energized to effect feedback regulation of the output. Further, transistors 42, 43 of the type used in high voltage inverters dissipate heat during periodic transistor conduction. As an alternative, the toroid heater 81 can use this heat for feedback regulation of the output or control of the temperature of transistors 42, 43.

The frequency dependent impedance means may also be used in a circuit to energize a gas discharge lamp at adjustable illumination levels. Adjustment in the inversion frequency of transistors 42, 43 results in control of the magnitude of the AC current supplied to the lamp.

This is preferably accomplished where saturable inductors 47, 49 have adjustable flux densities for control of their saturation time.

FIG. 7 schematically illustrates an alternate form of inverter circuit, shown without the AC to DC power supply connections for simplification. In this Figure, the transistors are connected in parallel rather than in series but the operation is essentially the same as previously described.

In particular, this circuit comprises a pair of alternately conducting transistors 91, 92. The emitter terminals of the transistors are connected to a B— line 93. A B+ lead 94 is connected to the center-tap of a transformer 96. In order to provide drive current to the transistors 91, 92 for control of their conduction frequency, saturable inductors 97, 98 have secondary windings 99, 101, respectively, each secondary winding having one end connected to the base of its associated transistor; the other ends are connected to a common terminal 102. One end of transformer 96 is connected to the collector of transistor 91 through a winding 103 on inductor 98 in turn connected in series with a winding 104 on inductor 97. Likewise, the other end of transformer 96 is connected to the collector of transistor 92 through a winding 106 on inductor 97 in series with another winding 107 on inductor 98.

The B+ terminal is connected to terminal 102 through a bias resistor 108. A bias capacitor 109 connects terminal 102 to the B— lead 93. This resistor and capacitor serve the same function as resistors 58, 59 and capacitors 56, 57 in the FIG. 2 circuit.

The bases of transistors 91, 92 are connected by diodes 111, 112, respectively, to a common Zener diode 113 in turn connected to the B— lead 93. The common Zener diode 113 serves the same function as individual Zener diodes 62, 64 in FIG. 2.

Shunt diodes 114, 116 are connected across the collector-emitter terminals of transistors 91, 92, respectively.

A capacitor 117 connecting the collectors of transistors 91, 92 restrains the rate of voltage rise on the collectors in a manner similar to the collector-emitter capacitor 68 in FIG. 2.

Inductive-capacitive loading of the FIG. 7 inverter is accomplished by a capacitor 118 connected in series with with an inductor 119, the combination being connected across the collectors of the transistors 91, 92. A load 121 is connected across the capacitor 118.

FIG. 8 illustrates how an inverter loaded with a series capacitor 122 and inductor 123 can be used to energize a "rapid-start" fluorescent lamp 124 (the details of the inverter circuit being omitted for simplication). The lamp 124 has a pair of cathodes 126, 127 connected across the capacitor 122 for supply of operating voltage in a manner identical to that previously described. In addition, the inductor 123 comprises a pair of magnetically-coupled auxiliary windings 128, 129 for electrically heating the cathodes 126, 127, respectively. A small capacitor 131 is connected in series with lamp 124.

Figure 9:
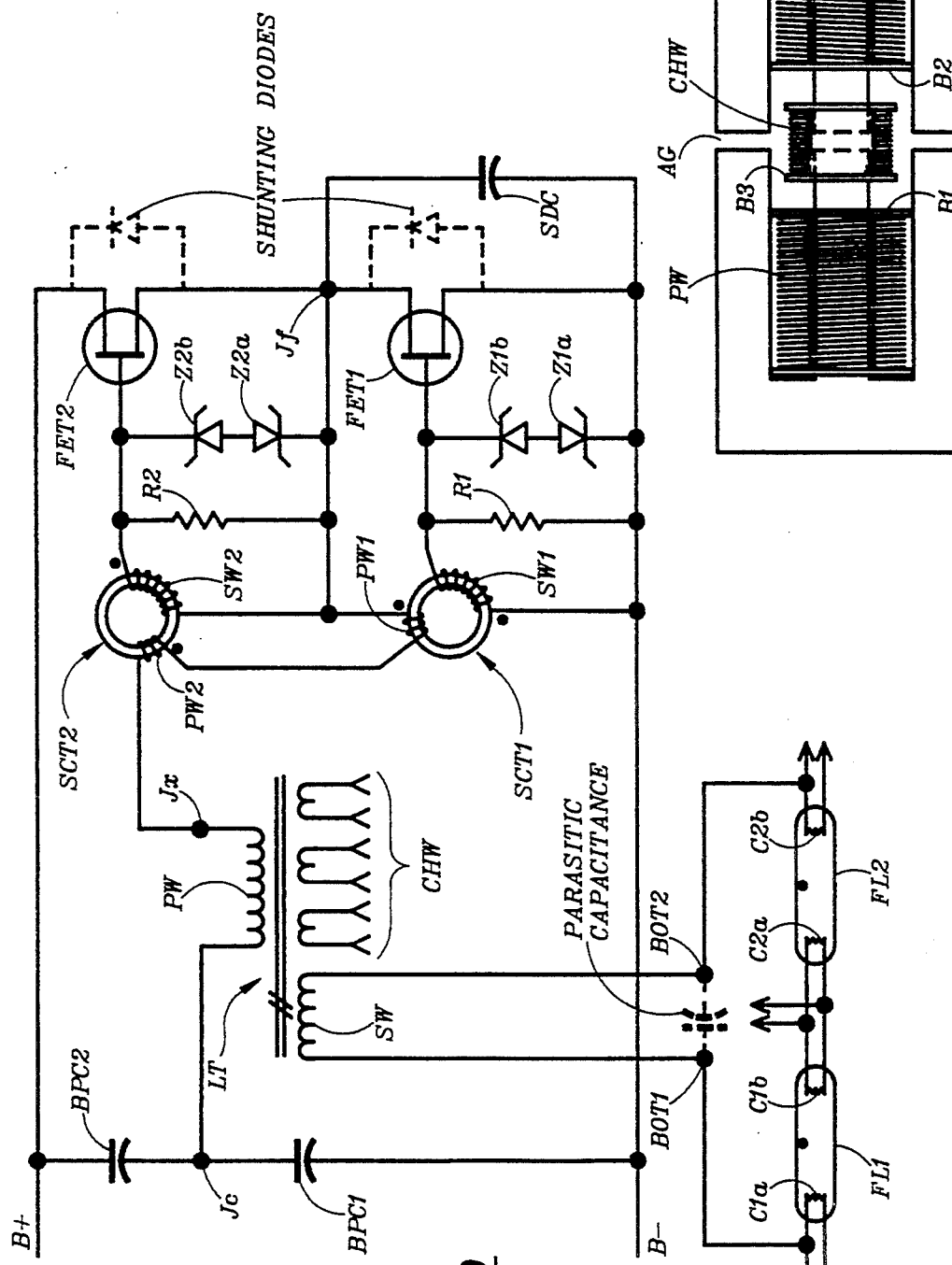
FIG. 9 is a schematic diagram illustrating an inverter ballast circuit arrangement wherein a pair of series-connected fluorescent lamps is powered, by way of a reactance transformer, from an inverter output voltage having a trapezoidal (i.e. truncated sinewave) waveform like that of FIG. 3A.

FIG. 9 shows an embodiment of the present invention that is expressly aimed at an alternative way of taking advantage of the fact that the inverter output voltage of the inverter circuit arrangement of FIG. 2 has the particular trapezoidal waveshape illustrated by FIG. 3A.

In FIG. 9, a DC supply voltage of about 320 Volt is assumed to be provided between a B— bus and a B+ bus.

A first high-frequency bypass capacitor BPC1 is connected between the B— bus and a junction Jc; and a second high-frequency bypass capacitor BPC2 is connected between junction Jc and the B+ bus. The source of a first field effect transistor FET1 is connected with the B— bus, while the drain of this same transistor is connected with a junction Jf. The source of a second field effect transistor FET2 is connected with junction Jf, while the drain of this same transistor is connected with the B+ bus. As shown in dashed outline, each field effect transistor has a commutating diode built-in between its drain and source. A slow-down capacitor SDC is connected between junction Jf and the B— bus.

The primary winding PW of a leakage transformer LT is connected between junction Jc and a junction Jx; the primary winding PW1 of a first saturable current transformer SCT1 is series-connected with the primary winding PW2 of a second saturable current transformer SCT2 between junctions Jf and Jx.

A secondary winding SW1 of transformer SCT1 is connected between the source and gate terminals of FET1; and a secondary winding SW2 of transformer SCT2 is connected between the source and gate terminals of FET2. A resistor R1 is connected across secondary winding SW1; and a resistor R2 is connected across secondary winding SW2. A Zener diode Z1a is connected with its cathode to the source of FET1 and with its anode to the anode of a Zener diode Z1b, whose cathode is connected with the gate of FET1. A Zener diode Z2a is connected with its cathode to the source of FET2 and with its anode to the anode of a Zener diode Z2b, whose cathode is connected with the gate of FET2.

A secondary winding SW of leakage transformer LT is connected between ballast output terminals BOT1 and BOT2.

A first fluorescent lamp FL1 is series-connected with a second fluorescent lamp FL2 to form a series-combination; which series-combination is connected between ballasts output terminals BOT1 and BOT2. Lamp FL1 has a first cathode C1a and a second cathode C1b; while lamp FL2 has a first cathode C2a and a second cathode C2b. Each cathode has two cathode terminals. Each of the terminals of cathode C1b is connected with one of the terminals of cathode C2a. Each cathode's terminals are connected with the terminals of one of three separate cathode heater windings CHW.

The leakage transformer of FIG. 9 is illustrated in further detail in FIG. 10. In particular and by way of example, leakage transformer LT includes a first and a second ferrite core element FC1 and FC2, each of which is an extra long so-called E-core; which E-cores abut each other across an air gap AG. Primary winding PW is wound on a first bobbin B1; and secondary winding SW is wound on a second bobbin B2. Cathode heating windings CHW are wound on a small third bobbin B3; which bobbin B3 is adjustably positioned between bobbins B1 and B2.

The operation of the circuit arrangement of FIG. 9 may best be understood by referring to the voltage and current waveforms of FIGS. 11A to 11F.

FIG. 11A shows the waveform of the voltage provided at the output of the half-bridge inverter of FIG. 9 during a situation where lamps FL1 and FL2 are being fully powered. In particular, FIG. 11A shows the waveform of the voltage provided at junction Jf as measured with reference to junction Jc. (The voltage at Jx is substantially equal to the voltage at Jf).

This waveform is substantially equal to that of FIG. 3A.

FIG. 11B shows the corresponding waveform of the gate-to-source voltage (i.e. the control voltage) of FET2.

FIG. 11C shows the corresponding drain current flowing through FET2; which is the current drawn by the upper half of the half-bridge inverter from the DC supply voltage (i.e., from the B+ bus).

FIG. 11D shows the corresponding current flowing through fluorescent lamps FL1 and FL2.

FIG. 11E shows the waveform of the voltage provided at the output of the half-bridge inverter of FIG. 9 for a situation where ballast output terminals BOT1/BOT2 are unloaded except for stray (or parasitic) capacitance associated with the wiring extending between ballast output terminals BOT1/BOT2 and lamp cathodes C1a and C2b.

The waveform of FIG. 11E is substantially equal to that of FIG. 11A except for an increase in the duration of each cycle period.

FIG. 11F shows the corresponding open circuit output voltage present across ballast output terminals BOT1 and BOT2.

Figure 11G:
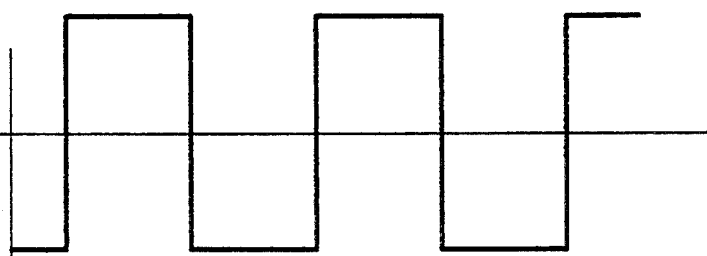

FIG. 11G shows the waveform of the voltage provided at the output of the half-bridge inverter of FIG. 9 for a situation where: (i) slowdown capacitor SDC has been removed; and (ii) ballast output terminals BOT1/BOT2 are unloaded except for stray (or parasitic) capacitance associated with the wiring extending between ballast output terminals BOT1/BOT2 and lamp cathodes C1a and C2b.

It is noted that the waveform of FIG. 11G is substantially a true squarewave as opposed to the trapezoidal (or truncated sinusoidal) waveforms of FIGS. 11A and 11E.

Figure 11H:
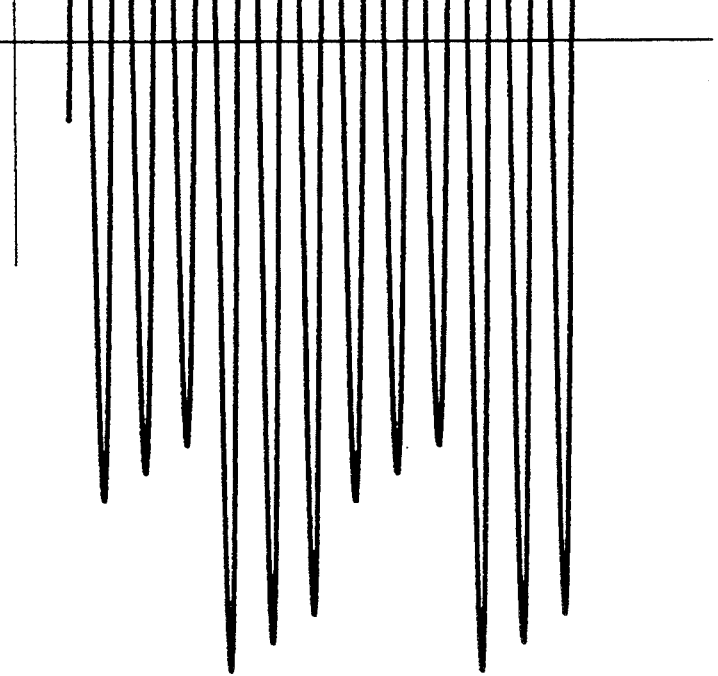

FIG. 11H shows the waveform of the corresponding voltage present across ballast output terminals BOT1 and BOT2.

The basic inverter part of FIG. 9 operates much like the inverter part of FIG. 2, except that the switching transistors are field effect transistors instead of bi-polar transistors.

The loading of the inverter, however, is different. In the circuit of FIG. 9, the inverter's output voltage is applied to the primary winding of a leakage transformer (LT); and the output is drawn from a primary winding of this leakage transformer. In this connection, it is important to notice that a leakage transformer is a transformer wherein there is substantial leakage of magnetic flux between the primary winding and the secondary winding; which is to say that a substantial part of the flux generated by the transformer's primary winding does not link with the transformer's secondary winding.

The flux leakage aspect of transformer LT is illustrated by the structure of FIG. 10. Magnetic flux generated by (and emanating from) primary winding PW passes readily through the high-permeability ferrite of ferrite core FC1. However, as long as secondary winding SW is connected with a load at its output (and/or if there is an air gap, as indeed there is), the flux emanating from the primary winding has to overcome magnetic impedance to flow through the secondary winding; which implies the development of a magnetic potential difference between the legs of the long E-cores—especially between the legs of ferrite core FC1. In turn, this magnetic potential difference causes some of the magnetic flux generated by the primary winding to flow directly between the legs of the E-cores (i.e. directly across the air gap between the legs of the E-cores), thereby not linking with (i.e. flowing through) the secondary winding. Thus, the longer the legs of the E-cores and/or the larger the air gap, the less of the flux generated by the primary winding links with the secondary winding—and conversely. As a result, the magnitude of the current available from the secondary winding is limited by an equivalent internal inductance.

Due to the substantial air gap (AG), the primary winding of leakage transformer LT is capable of storing a substantial amount of inductive energy (just as is the case with inductor 51 of FIG. 2). Stated differently but equivalently, leakage transformer LT has an equivalent input-shunt inductance (existing across the input terminals of its primary or input winding) capable of storing a substantial amount of energy. It also has an equivalent output-series inductance (effectively existing in series with the output terminals of its secondary or output winding) operative to limit the magnitude of the current available from its output. It is important to recognize that the input-shunt inductance is an entity quite separate and apart from the output-series inductance.

Just as in the circuit of FIG. 2, when one of the transistors is switched OFF, the current flowing through primary winding PW can not instantaneously stop flowing. Instead, it must continue to flow until the energy stored in the input-shunt inductance is dissipated and/or discharged. In particular and by way of example, at the moment FET2 is switched OFF, current flows through primary winding PW, entering at the terminal connected with junction Jx and exiting at the terminal connected with junction Jc. Just after the point in time where FET2 is switched OFF, this current will continue to flow, but—since it can not any longer flow through transistor FET2—it must now flow through slow-down capacitor SDC. Thus, the current drawn out of capacitor SDC will cause this capacitor to change its voltage: gradually causing it to decrease from a magnitude of about +160 Volt (which is the magnitude of the DC supply voltage present at the B+ bus as referenced-to junction Jc) to about −160 Volt (which is the magnitude of the DC supply voltage present at the B− bus as referended-to junction Jc). Of course, as soon as it reaches about −160 Volt, it gets clamped by the commutating (or shunting, or clamping ) diode built-into FET1; which built-in diode corresponds to shunting diode 67 of the FIG. 2 circuit.

The resulting waveform of the inverter's output voltage will be as illustrated by FIGS. 11A and 11E. The slope of the inverter output voltage as it alternatingly changes between −160 Volt and +160 Volt is determined by two principal factors: (i) the value of the input-shunt inductance of primary winding PW; and (ii) the magnitude of slow-down capacitor SDC. The lower the capacitance of the slow-down capacitor, the steeper the slope. The lower the inductance of the input-shunt inductance, the steeper the slope. Without any slow-down capacitor, the slope will be very steep: limited entirely by the basic switching speed of the inverter's transistors; which, for field effect transistors is particularly high (i.e. fast).

In particular, in the circuit of FIG. 9, the relatively modest up- and down-slopes of the inverter's output voltage (see waveforms of FIGS. 11A and 11E)—which are determined by the capacitance of the slow-down capacitor—are chosen to be far lower than the very steep slopes that result when the slow-down capacitor is removed; which latter situation is illustrated by FIG. 11G. In fact, the slopes of the inverter's output voltage are chosen in such manner as to result in this output voltage having a particularly low content of harmonic components, thereby minimizing potential problems associated with unwanted resonances of the output-series inductance with parasitic capacitances apt to be connected with ballast output terminals BOT1-/BOT2 by way of more-or-less ordinary wiring harness means used for connecting between these output terminals and the associated fluorescent lamps (FL1 and FL2).

With the preferred capacitance value of slow-down capacitor SDC, the inverter output voltage waveform will be as shown in FIGS. 11E, and the output voltage provided from secondary winding SW—under a condition of no load other than that resulting from a parasitic resonance involving a worst-value of parasitic output capacitance—will be as shown in FIG. 11F.

On the other hand, without having any slow-down capacitor, the inverter output voltage waveform will be as shown in FIG. 11G, and the output voltage provided from secondary winding SW —under a condition of no load other than that resulting from a parasitic resonance involving a worst-value of parasitic output capacitance—will be as shown in FIG. 11 H. Under this condition, the power drawn by the inverter from its DC supply is more than 50 Watt; which power drain result from power dissipations within the inverter circuit and—if permitted to occur for more than a very short period—will cause the inverter to self-destruct.

On the other hand, the power drawn by the inverter under the same identical condition except for having modified the shape of the inverter's output voltage to be like that of FIG. 11E (instead of being like that of FIG. 11 G) is only about 3 Watt; which amount of power drain is small enough not to pose any problem with respect to inverter self-destruction, nor even with respect to excessive power usage during extended periods where the inverter ballast is connected with its power source but without actually powering its fluorescent lamp load.

One difference between the circuit of FIG. 2 and that of FIG. 9 involves that fact that the FIG. 9 circuit uses field effect transistors. Never-the-less, the control of each transistor is effected by way of saturable current feedback transformers. However, instead of delivering its output current to a base-emitter junction, each current transformer now delivers its output current to a pair of series-connected opposed-polarity Zener diodes (as parallel-connected with a damping resistor and the gate-source input capacitance). The resulting difference in each transistor's control voltage is seen by comparing the waveform of FIG. 3B with that of FIG. 11B. In either case, however, the transistor is not switched into its ON-state until after the absolute magnitude of the voltage across its switched terminals (i.e. the source-drain terminals for a FET) has substantially diminished to zero.

In further contrast with the arrangement of FIG. 2, the inverter circuit of FIG. 9 is not loaded by way of a series-tuned L-C circuit. Instead, it is in fact loaded with a parallel-tuned L-C circuit; which parallel-tuned L-C circuit consists of the slow-down capacitor SDC as parallel-connected with the input-shunt inductance of primary winding PW. Yet, in complete contrast with other inverters loaded with parallel-tuned L-C circuits, the inverter of FIG. 9 is powered from a voltage source providing a substantially fixed-magnitude (i.e. non-varying) DC voltage.

Also in complete contrast with other inverters loaded with parallel-tuned L-C circuits, the inverter circuit of FIG. 9 provides for clamping (or clipping or truncating) of the naturally sinusoidal resonance voltage that would otherwise (i.e. in the absence of clamping ) develop across the parallel-tuned L-C circuit; which naturally sinusoidal resonance voltage is illustrated by the dashed waveform of FIG. 11E.

In the FIG. 9 circuit, the indicated voltage clamping (or clipping or truncating) is accomplished by way of the commutating (or shunting) diodes built into each of the field effect switching transistors. In the FIG. 2 circuit, this clamping is accomplished by shunting diodes 66 and 67.

As previously indicated, to minimize the spurious and potentially damaging resonances which might occur due to an unknown parasitic capacitance becoming connected with ballast output terminals BOT1 and BOT2, it is important to minimize the harmonic content of the inverter's output voltage (which harmonic content—for a symmetrical inverter waveform—consists of all the odd harmonics in proportionally diminishing magnitudes). To attain such harmonic minimization, it is important that the inverter's output voltage be made to match or fit as nearly as possible the waveform of a sinusoidal voltage; which "best fit" occurs when the duration of the up/down-slopes equals about 25% of the total cycle period; which, as can readily be seen by direct visual inspection, corresponds closely to the waveforms actually depicted by FIGS. 3A, 11A and 11E.

However, substantial beneficial effects actually results even if the total duration of the up/down slopes were to be less than 25% of the total duration of the inverter output voltage period. In fact, substantial beneficial effects are attained with up-down slopes constituting as little as 10% of the total cycle period.

DESCRIPTION OF SPECIAL EMBODIMENT

Figure 12:
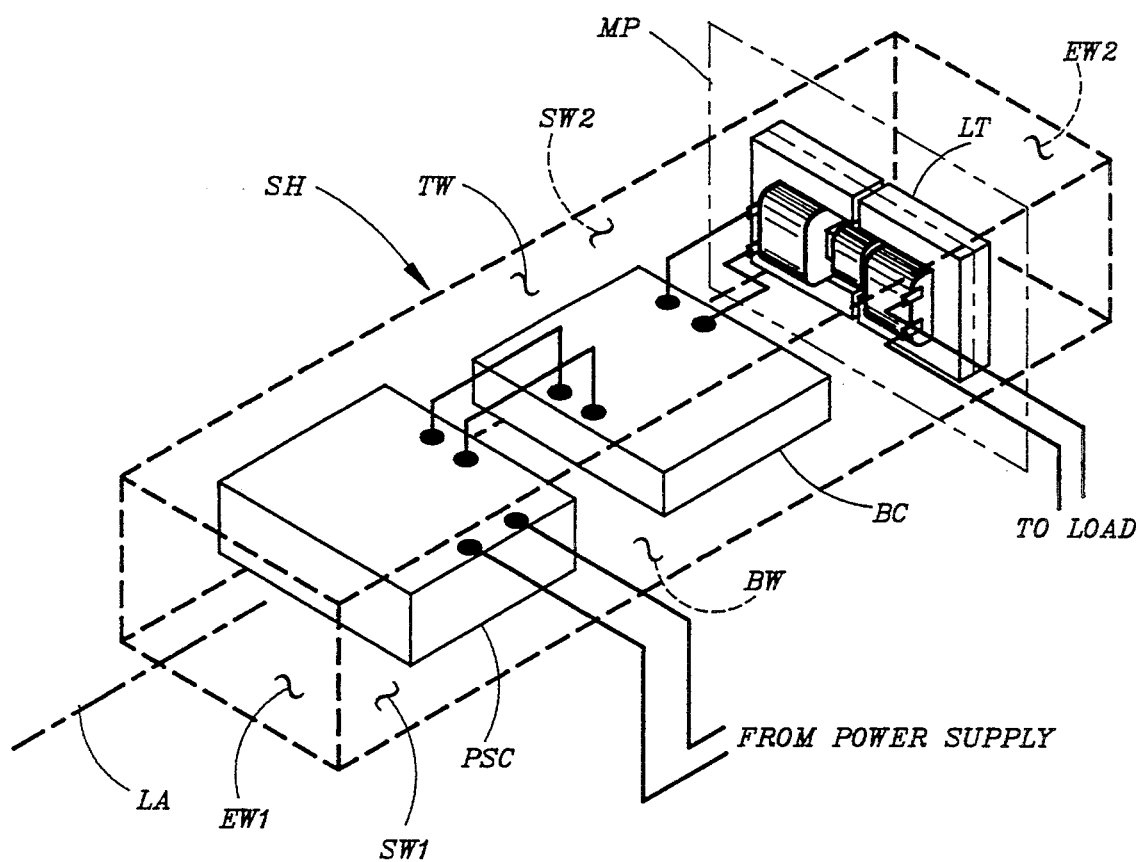
FIG. 12 shows the orientation of the leakage transformer within a conventional steel ballast housing.

A special embodiment of the present invention includes the circuit illustrated in FIG. 9 mounted within a steel housing such as that illustrated by FIG. 12.

A steel housing SH has a longitudinal axis LA, a bottom wall BW, a top wall TW, side walls SW1 and SW2, and end walls EW1 and EW2.

Within steel housing SH is mounted a power supply circuit PSC (such as that indicated by element 23 in FIG. 2). This power supply circuit is connected with a ballast circuit BC; which ballast circuit preferably includes the circuitry of FIG. 9, except for its leakage transformer LT; which leakage transformer is shown as a separate entity mounted in such manner as to have its main plane MP—i.e., a plane parallel to the magnetic flux in its ferrite core—disposed perpendicularly to longitudinal axis LA of the steel housing SH. Also, leakage transformer LT is mounted a substantial distance away from end walls EW1 and EW2 of steel housing SH.

As with any leakage transformer, leakage transformer LT has a magnetic leakage flux; which magnetic leakage flux—for the E-core-type leakage transformer actually illustrated—extends mainly into the air space at each side of the leakage transformer's main plane. However, the density (or intensity) of the leakage flux diminishes sharply with distance away from the leakage transformer's main plane. Thus, to minimize the degree to which this leakage flux couples with the walls of the steel housing (thereby to minimize concomitant wasteful power dissipation) it is important to locate these walls as far away as reasonably possible from the leakage flux.

Since it is indeed for several practical reasons desirable that the housing be made of steel, and since the size and shape of the steel housing is to a large extent given, the only realistic option available for minimizing useless power dissipation in an electronic ballasts with a leakage transformer is to locate this leakage transformer within the steel housing in such manner as to minimize the degree with which the leakage flux couples with the steel walls of the housing.

Ideally, minimum coupling would result with the leakage transformer disposed in the exact middle of the steel housing, with its main plain perpendicular to the housing's longitudinal axis. However, for most practical purposes, it is entirely sufficient to position the leakage transformer somewhat off center, such as indicated in FIG. 12.

Ordinarily, for ease of assembly, E-core-type transformers in electronic ballasts are located within the steel housing such that the transformer's main plane is parallel with the housing's bottom/top walls BW/TW; which is the absolute worst location with respect to generating unnecessary power losses.

The dimensions of a commonly used steel casing for electronic ballasts are as follows: bottom wall BW and top wall TW are each about 2.3" wide and 8.2" long; side walls SW1 and SW2 are each about 1.5" high and 8.2" long; and end walls EW1 and EW2 are each about 2.3" wide and 1.5" high.

Thus, for ballast housings with aspect ratios approximately like those of the above-indicated commonly used steel housing, a most energy-efficient location for the leakage transformer is as shown in FIG. 12. Nevertheless, any position where the transformer's main plane is substantially perpendicular to the plane of bottom wall BW is substantially more efficient that a position where the transformer's main plane is parallel with the bottom wall.

It is also important to position the leakage transformer about in the middle between bottom wall BW and top wall TW.

Additional Explanations and Comments (a) With reference to FIGS. 2 and 5, adjustment of the amount of power supplied to load 26′, and thereby the amount of light provided by lamp 71, may be accomplished by applying a voltage of adjustable magnitude to input terminals IP1 and IP2 of the Toroid Heater; which is thermally coupled with the toroidal ferrite cores of saturable transformers 47, 49.

(b) With commonly available components, inverter circuit 24 of FIG. 2 can be made to operate efficiently at any frequency between a few kHz to perhaps as high as 50 kHz. However, for various well-known reasons (i.e., eliminating audible noise, minimizing physical size, and maximizing efficiency), the frequency actually chosen is in the range of 20 to 40 kHz.

(c) The fluorescent lighting unit of FIG. 1 could be made in such manner as to permit fluorescent lamp 11 to be disconnectable from its base 12 and ballasting means 16. However, if powered with normal line voltage without its lamp load connected, frequency-converting power supply and ballasting circuit 16 is apt to self-destruct.

To avoid such self-destruction, arrangements can readily be made whereby the very act of removing the load automatically establishes a situation that prevents the possible destruction of the power supply and ballasting means. For instance, with the tank capacitor (52) being permanently connected with the lamp load (11)—thereby automatically being removed whenever the lamp is removed—the inverter circuit is protected from self-destruction.

(d) At frequencies above a few kHz, the load represented by a fluorescent lamp—once it is ignited—is substantially resistive. Thus, with the voltage across lamp 11 being of a substantially sinusoidal waveform (as indicated in FIG. 3d), the current through the lamp will also be substantially sinusoidal in waveshape.

(e) In the fluorescent lamp unit of FIG. 1, fluorescent lamp 11 is connected with power supply and ballasting circuit 16 in the exact same manner as is load 26 connected with the circuit of FIG. 2. That is, it is connected in parallel with the tank capacitor (52) of the L-C series-resonant circuit. As is conventional in instant-start fluorescent lamps-such as lamp 11 of FIG. 1—the two terminals from each cathode are shorted together, thereby to constitute a situation where each cathode effectively is represented by only a single terminal. However, it is not necessary that the "two terminals from each cathode be shorted together; in which case—for instant-start operation—connection from a lamp's power supply and ballasting means need only be made with one of the terminals of each cathode.

(f) In FIG. 9, a Parasitic Capacitance is shown as being connected across terminals BOT1 and BOT2. The value of this parasitic capacitance may vary over a wide range, depending on unpredictable details of the particular usage situation at hand. Values for the parasitic capacitance will expectedly vary between 100 and 1000 pico-Farad—depending on the nature of the wiring harness used for connecting between the output of secondary winding SW and the plural terminals of lamps FL1/FL2.

(g) The worst case of parasitic oscillation associated with the circuit arrangement of FIG. 9 is apt to occur when the value of the parasitic capacitance (i.e., the capacitance of the ballast-to-lamp wiring harness) is such as to cause series-resonance with the output-series inductance of secondary winding SW at the third harmonic component of the inverter's output voltage. The next worst case of parasitic oscillation is apt to occur when the value of the parasitic capacitance is such as to series-resonate with the output-series inductance at the fifth harmonic component of the inverter's output voltage. With the typical value of 5.4 milli-Henry for the output-series inductance, it takes a total of about 600 pico-Farad to resonate at the third harmonic component of the inverter's 30 kHz output voltage; and it takes about 220 pico-Farad to resonate at the fifth harmonic component of the inverter's output voltage. These capacitance values are indeed of such magnitudes that they may be encountered in an actual usage situation of an electronic ballast. Moreover, at higher inverter frequencies, the magnitudes of the critical capacitance values become even lower.

(h) FIG. 10 shows cathode heater windings CHW placed on a bobbin separate from that of primary winding PW as well as separate from that of secondary winding SW. However, in many situations, it would be better to place the cathode heater windings directly onto the primary winding bobbin B1. In other situations it would be better to place the cathode heater windings directly onto the secondary winding bobbin B2.

If the cathode heater windings are wound on bobbin B1 (i.e. in tight coupling with the primary winding), the magnitude of the cathode heating voltage will remain constant regardless of whether or not the lamp is ignited; which effect is conducive to maximixing lamp life. On the other hand, if the cathode heater windings are wound on bobbin B2 (i.e. in tight coupling with the secondary winding), the magnitude of the cathode heating voltage will be high prior to lamp ignition and low after lamp ignition; which effect is conducive to high luminous efficacy.

By placing the cathode heater windings in a location between primary winding PW and secondary winding SW, it is possible to attain an optimization effect: a maximization of luminous efficacy combined with only a modest sacrifice in lamp life. That is, by adjusting the position of bobbin B3, a corresponding adjustment of the ratio of pre-ignition to post-ignition cathode heater voltage magnitude may be accomplished.

(i) For easier lamp starting, a starting aid capacitor may be used in shunt across one of the fluorescent lamps FL1/FL2.

Also, a starting aid electrode (or ground plane) may advantageously be placed adjacent the fluorescent lamps; which starting aid electrode should be electrically connected with the secondary winding, such as via a capacitor of low capacitance value.

(j) To control (reduce) the degree of magnetic coupling between primary winding PW and secondary winding SW, a magnetic shunt may be positioned across the legs of the E-cores—in a position between bobbins B1 and B3.

(k) Considering the waveforms of FIGS. 1A, 11A and 11e each to include 360 degrees for each full and complete cycle: (i) each half-cycle would include 180 degrees; (ii) each total up-slope would include almost or about 60 degrees degrees; (iii) each total down-slope would include almost or about 60 degrees; and (iv) each horizontal segment would include about 120 degrees or more. Yet, as previously indicated, substantial utility may be attained even if each complete up-slope and down-slope were to include as little 18 degrees.

(l) In the FIG. 9 circuit, the inverter's operating frequency is not ordinarily (or necessarily) equal to the natural resonance frequency of the parallel-tuned L-C circuit that consists of slow-down capacitor SDC and the input-shunt inductance of primary winding PW. Rather, the inverter's actual operating frequency is ordinarily lower than would be this natural resonance frequency.

(m) In a trapezoidal waveform that constitutes a best fit for a sinusoidal waveform, the peak magnitude is lower than that of the sinusoidal waveform, and the up-slope and down-slope are each steeper that the corresponding slopes of the sinusoidal waveform.

(n) The FIG. 9 inverter arrangement has to be triggered into self-oscillation. A suitable automatic triggering means would include a resistor, a capacitor, and a so-called Diac. However, manual triggering may be accomplished by merely momentarily connecting a discharged capacitor (of relatively small capacitance value) between the gate of transistor FET1 and the B+ bus.

(o) Most switching-type field effect transistors have built-in commutating (or shunting) diodes, as indicated in FIG. 9. However, if such were not to be the case, such diodes should be added externally, as indicated in the FIG. 2 circuit.

(p) In ordinary inverter circuits, the inverter output voltage is effectively a squarewave voltage with very steep up-slopes and down-slopes. In inverters using so-called field effect transistors, the time required for the inverter's squarewave output voltage to change between its extreme negative potential to its extreme positive potential is usually on the order of 100 nanoseconds or less. In inverters using bi-polar transistors, this time is usually on the order of 500 nanoseconds or less. In the inverter of the FIG. 9 circuit, however, this time has been extended—by way of the large-capacitance-value slow-down capacitor SDC—to be on the order of several micro-seconds, thereby achieving a substantial reduction of the magnitudes of the harmonic components of the inverter's (now trapezoidal) output voltage.

(q) In an actual prototype of the FIG. 9 ballast circuit —which prototype was designed to properly power two 48 inch 40 Watt T-12 fluorescent lamps—the following approximate parameters and operating results prevailed:

1. operating frequency: about 30 kHz;
2. slow-down capacitor: 0.02 micro-Farad;
3. shunt-input inductance: 1.4 milli-Henry;
4. up-slope duration: about 4 micro-seconds;
5. down-slope duration: about 4 micro-seconds;
6. series-output inductance: 5.4 milli-Henry;
7. parasitic capacitance across BOT1/BOT2 terminals; 800 pico-Far ad;
8. power consumption when unloaded: about 4 Watt;
9. power consumption when loaded with two F40/T12 fluorescent lamps: about 70 Watt;
10. power consumption when unloaded but with slow-down capacitor removed: about 80 Watt.

It is be noted that the natural resonance frequency of the L-C circuit consisting of a slow-down capacitor of 0.02 micro-Farad as parallel-combined with a shunt-input inductance of about 1.4 milli-Henry is about 30 kHz. This means that—as far as the fundamental component of the 30 kHz inverter output voltage is concerned—the parallel-tuned L-C circuit represents a very high impedance, thereby constituting no substantive loading on the inverter's output.

(r) Of course, the FIG. 9 ballast circuit can be made in the form of a push-pull circuit such as illustrated by FIG. 7; in which case center-tapped transformer 96 would be modified in the sense of being made as a leakage transformer in full correspondence with leakage transformer LT of FIG. 9. Also, of course, inductor 119, capacitor 118, and load 121 would be removed. Instead, the load would be placed at the output of the secondary winding of the modified center-tapped transformer 96; which would be made such as to have appropriate values of input-shunt inductance and output-series inductance. Capacitor 117 would constitute the slow-down capacitor.

(s) The ballast housing illustrated in FIG. 12 would ordinarily be made of steel. However, it might be made of other materials, such as aluminum. Never-the-less, except if properly orienting the leakage transformer, substantial losses may still result due to coupling of the leakage flux to the walls of the housing.

(t) The shape of the ballast housing of FIG. 12 may be described as parallelepiped. Alternatively, it may be described as being a cylinder with a substantially rectangular crosssection. This cylinder would typically be about 8.2" long; and its approximately rectangular cross-section would be about 2.3" wide and about 1.5" high.

(u) The magnetic core of leakage transformer LT is actually a ferro-magnetic core made of ferrite. The magnetic flux lines in this ferro-magnetic core are substantially parallel with each other; and the a plane passing through the middle of the ferrite core and oriented parallel with the magnetic flux lines therein is referred-to as the main plane of the magnetic core or of the leakage transformer.

DESCRIPTION OF PREFERRED EMBODIMENT

Figure 13:
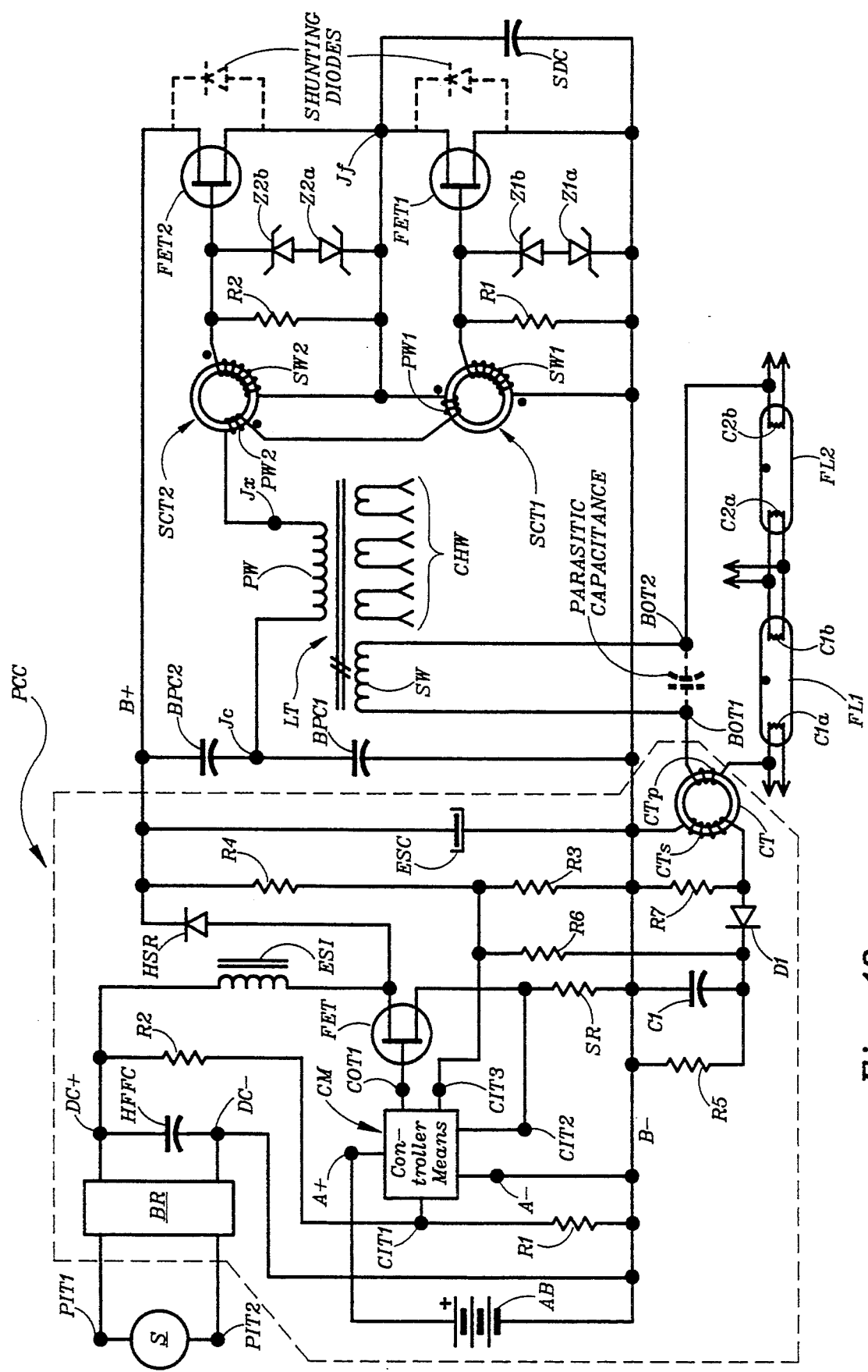
FIG. 13 illustrates the addition, to the circuit arrangement in FIG. 9, of a pre-converter-type DC power supply with means for controlling the magnitude DC voltage by way of a control input at the pre-converter.

FIG. 13 is a schematic diagram representing a preferred embodiment of the invention.

Basically, FIG. 13 represents a ballast, such as that of FIG. 9, but with a pre-converter-type power supply operative to draw power from the power line with a particularly high power factor. The pre-converter uses a conventional integrated circuit controller, such as Motorola's MC34261; which controller, via a FET and an energy-storing inductor, is operable to provide a DC supply voltage of chosen constant magnitude; which magnitude can be set by feeding back, to a control input at the controller, a proportional measure of the DC magnitude. Then, by choosing the proportion of the DC voltage fed back, the magnitude of the DC voltage can be set to a desired constant level.

Details of Construction of Preferred Embodiment

FIG. 13 includes the circuit of FIG. 9 in its totality. However, for current-magnitude control purposes, primary winding CTp of a current transformer CT has been series-connected with the lead connecting ballast output terminal BOT1 with cathode C1a.

Otherwise, FIG. 13 includes a pre-converter circuit PCC; which pre-converter circuit has a bridge rectifier BR with a pair of power input terminals PIT1 and PIT2 connected with a source S of ordinary power line voltage. Across DC output terminals DC− and DC+ of the bridge rectifier is connected a high-frequency filter capacitor HFFC. The DC− terminal is connected directly with the B− bus.

A controller means CM has a positive power input terminal A+ and a negative power input terminal A−, which A− terminal is connected with the B− bus. An "A" battery AB is connected with its positive terminal to the A+ terminal and with its negative terminal to the B− bus.

The controller means has: (i) a first control input terminal CIT1, which is connected with the B− bus via a resistor R1 and with the DC+ terminal via a resistor R2; (ii) a second control input terminal CIT2, which is connected with the B− bus via a sampling resistor SR; (iii) a third control input terminal CIT3, which is connected with the B− bus via a resistor R3 and with the B+ bus via a resistor R4; and (iv) a control output terminal COT1, which is connected with the gate terminal of a field effect transistor FET.

An energy-storing inductor ESI is connected between the DC+ terminal and the drain terminal of transistor FET; which drain terminal is also connected with the anode of a high-speed rectifier HSR, whose cathode is connected with the B+ bus. The source terminal of transistor FET is connected with the B− bus via sampling resistor SR as well as with terminal CIT2 of controller means CM. An energy-storing capacitor ESC is connected between the B− bus and the B+ bus.

The output terminals of secondary winding CTs of current transformer CT are connected between the B− bus and the anode of a diode D1, whose cathode is connected with the B− bus via a resistor R5. A resistor R6 is connected between the cathode of diode D1 and terminal CIT3 of controller means CM; and a capacitor C1 is connected between the cathode of diode D1 and the B− bus. A resistor R7 is connected across the output terminals of secondary winding CTs.

Details of Operation of Preferred Embodiment

As far as the basic hallasting function is concerned, the operation of the circuit arrangement of FIG. 13 is substantially the same as that of the circuit arrangement of FIG. 9. The only significant differences relate to how the DC supply voltage is obtained and how its magnitude is controlled.

The pre-converter circuit PCC operates in a conventional manner, with energy being periodically stored in energy-storing inductor ESI and periodically dumped into energy-storing capacitor ESC—all being effectuated by switching transistor FET ON/OFF in a controlled and well known manner.

For the pre-converter circuit to operate properly, the absolute magnitude of the B+ voltage (i.e., the DC supply voltage present between the B− bus and the B+ bus) must be substantially higher than the absolute peak magnitude of the power line voltage provided from source C.

The controller means, which mainly includes a conventional pre-converter IC (such as Motorola's MC34261), functions in such manner that when the magnitude of the control voltage provided at control input terminal CIT3 exceeds a certain pre-determined level, the drive signal provided to the gate of transistor FET —which signal is normally provided from control output terminal COT1—ceases to be provided; which means that no further energy will be pumped into energy-storing capacitor ESC. As the magnitude of the control voltage decreases below this predetermined level, drive signal will again be provided, and energy will again be pumped into capacitor ESC—with the amount of energy pumped being proportional (up to a point) to the degree by which the magnitude of the control signal is lower than the pre-determined level.

Thus, at a given amount of power being drawn by the ballast circuit connected with the DC supply voltage, to maintain the magnitude of this DC supply voltage at a constant level, the magnitude of the control voltage provided to terminal CIT3 will have to be a certain small amount lower than the pre-determined level.

By providing to terminal CIT3 a control voltage of magnitude proportional to that of the DC supply voltage, the magnitude of the DC supply voltage will keep increasing until reaching a magnitude that causes the control voltage to attain the particular magnitude that corresponds to the magnitude of the DC supply voltage.

Thus, in the circuit arrangement of FIG. 13, with no current flowing in the fluorescent lamps, by way of the voltage divider consisting of resistors R4 and R3 (neglecting the effect of resistor R5), the magnitude of the DC supply voltage will be determined be the R4/R3 ratio.

Using a typical pre-converter IC (such as Motorola's MC34261) in controller means CM, the magnitude of the control voltage at terminal CIT3 needs to be about 2.5 Volt before the control output signal ceases to be provided to the gate of transistor FET; which means that, if the desired magnitude of the DC supply voltage be 400 Volt, the R4/R3 ratio must be 160.

The magnitude of the lamp current delivered to lamps FL1 and FL2 is approximately proportional to the magnitude of the DC supply voltage. Thus, by controlling the magnitude of the DC supply voltage, the magnitude of the lamp current can be controlled.

Conversely, by using a measure for the magnitude of the lamp current to control the magnitude of the DC supply voltage, the magnitude of the lamp current can be controlled.

In particular, in the circuit arrangement of FIG. 13, with no lamp current flowing, the magnitude of the DC supply voltage —which is now solely determined by the feedback provided from the DC supply voltage by way of the R4/R3 voltage divider—will be at a certain higher level. However, when lamp current is flowing, a positive voltage will develop at the cathode of diode D1; which positive voltage will cause the magnitude of the control voltage at terminal CIT3 to be higher than it would be otherwise. Thus, with lamp current flowing, the pre-converter circuit will regulate the magnitude of the DC supply voltage to a certain lower level that when lamp current is not flowing.

By arranging for the magnitude of the lamp current to be higher than desired when the ballast inverter is powered with a DC supply voltage at said certain higher level, and by properly adjusting the values of the magnitude of the DC voltage developing at the cathode of diode D1, as soon as lamp current starts flowing, the magnitude of the DC supply voltage will—by negative feedback action—be reduced to the point where the magnitude of the lamp current is at the desired level.

In particular, the various components are selected and adjusted such that at any lamp current of magnitude higher than the desired level, the magnitude of the voltage developing at the cathode of diode D1 is sufficiently high to cause the preconverter circuit to reduce the flow of power to energy-storing capacitor ESC; which, in turn, will have the effect of reducing the magnitude of the DC supply voltage; which, in turn, will reduce the magnitude of the lamp current; etc.

Thus, when unloaded, the circuit arrangement of FIG. 13 regulates the magnitude of the DC supply voltage to some desired no-load voltage level. When loaded, the circuit arrangement of FIG. 13 regulates the magnitude of the output current to some desired load current level by way of automatically reducing the magnitude of the DC supply voltage to be lower than said desired no-load voltage level. For this control arrangement to work, it is necessary that the load current level resulting when the magnitude of the DC supply voltage is at the desired no-load voltage level be higher than said desired load current level.

Yet Additional Comments (v) A basic element of the present invention relates to using the pre-converter circuit for regulating not only the magnitude of the DC supply voltage, but also some other parameter, such as the magnitude of an output current or voltage.

For this concept to apply, it is desirable that—in the absence of feedback—the magnitude of the resulting DC supply voltage will keep on increasing to some very high value. Then by application of negative feedback control, this magnitude can be cut back to any one of several potentially desirable levels. However, it is necessary that these multiple levels not conflict with each other; which is why it is necessary that the no-load DC supply voltage be regulated to a level that is higher than the DC supply voltage level that results when loading is at a desired level.

In other words, by way of the pre-converter circuit, the magnitude of the DC voltage can be controlled to prevent any one of several variables from exceeding some given level.

For instance, with reference to the transient voltages depicted in FIG. 11H, by appropriate feedback, the magnitude of these transient voltages can be prevented from exceeding some pre-determined level.

(w) With respect to the ballast arrangement of FIG. 13, a main purpose for controlling the magnitude of the lamp current is that of compensating for possible inaccuracies in the parameters of the various components in the ballast circuit (including the lamps), thereby—for mass production purposes —not having to specify the parameters of the components with accuracies as high as otherwise necessary.

(x) In the circuit arrangement of FIG. 13, it is possible by very simple means to use the very presence of lamp current to de-activate the feedback provided to control input terminal CIT3 from the B+ voltage, in which case it be possible to control the magnitude of the lamp current in a more flexible manner.

For instance, with no lamp current flowing, the magnitude of the DC supply voltage could be regulated to a given substantially constant level (regardless of variations in the magnitude of the power line voltage supplied from source S); yet, after lamp current starts to flow, the magnitude of this lamp current could now be increase or decreased from the level associated with this given level.

In other words, prior to lamp ignition, the magnitude of the DC supply voltage may be regulated to a magnitude such as to provide for a lamp ignition voltage of proper magnitude; whereas, after lamp ignition, the magnitude of the DC supply voltage may (in total independence of the prior regulation of the pre-ignition DC voltage magnitude) be controlled so as to achieve a lamp current of a particular desired magnitude.

(y) Within a limited degree, the magnitude of the DC supply voltage may be controlled so as to attain a dimming function; in which case, a dimmed level of light output may be attained without thereby (in the dimmed position) compromising the ballast's ability to ignite the gas discharge lamp.

(z) It is thought that the present invention and many of its attendant advantages will be understood from the foregoing description and that many changes may be made in the form and construction of its components parts, the form described being merely a preferred embodiment of the invention.

What is claimed is:

1. An arrangement comprising:
a DC source operative to provide a DC supply voltage at a pair of DC output terminals; the source having a control input operative, on receipt of a control signal, to control the magnitude of the DC supply voltage; the DC source being characterized by causing the magnitude of the DC voltage to reach an undesirably high voltage level in the absence of the control signal; the DC source also being characterized by providing the control signal to the control input whenever the magnitude of the DC voltage exceeds a certain desirable voltage level; the certain desirable voltage level being lower than said undesirably high voltage level;

a lamp means having a pair of lamp input terminals operative to receive lamp current;

an inverter circuit having a pair of DC input terminals and a pair of AC output terminals; the DC input terminals being connected with the DC output terminals; and lamp connection circuit operative to provide connection between the lamp input terminals and the AC output terminals, thereby to cause lamp current to be supplied to the lamp from the AC output terminals; the lamp connection circuit also having a control output connected with the control input and being operative to provide the control signal to the control input whenever the magnitude of the lamp current exceeds a certain desired current level, thereby to prevent the magnitude of the lamp current from exceeding the certain desired current level even though, in the absence of connection between the control output and the control input, the magnitude of the lamp current would have exceeded the certain desired current level.

2. The arrangement of claim 1 wherein the DC source includes a pre-conditioner circuit having an energy-storing inductor periodically charged from a primary DC voltage source and discharged into an energy-storing capacitor.

3. The arrangement of claim 1 wherein the lamp is a gas discharge lamp.

4. An arrangement comprising:
an AC source operative to provide an AC source voltage at a pair of AC source terminals;
a conditioning circuit connected with the AC source terminals and operative to provide a DC supply voltage at a pair of DC output terminals; the conditioning circuit including a control circuit having an auxiliary control input receptive of an auxiliary control signal; the control circuit being operative: (a) when not being provided with said auxiliary control signal, to control the magnitude of the DC supply voltage so as to maintain it at or near a certain maximum desirable level substantially irrespective of significant changes in the magnitude of (i) any current flowing from the DC output terminals, and (ii) the AC source voltage; and (b) when being provided with said auxiliary control signal, to cause the magnitude of the DC supply voltage to be controlled to a level lower than said certain maximum desirable level; and
a ballast circuit having a pair of DC input terminals connected with the DC output terminals and being operative to provide an AC output from a set of AC output terminals; the AC output terminals being adapted to connect with and, when indeed so connected, to provide lamp current to a gas discharge lamp; the ballast circuit having a control output operative to provide a signal in response to the presence in the ballast circuit of a voltage or current of magnitude even slightly larger than a certain desirable magnitude; the control output being connected with the auxiliary control input, thereby (i) to provide said auxiliary control signal to the auxiliary control input, and (ii) to prevent the presence of such a voltage or current of magnitude substantially larger than said certain desirable magnitude.

5. The arrangement of claim 4 wherein, in case the magnitude of the DC supply voltage were to be at or near said certain maximum desirable level, the magnitude of the lamp current would be larger than said certain desirable magnitude.

6. The arrangement of claim 4 wherein, in case the control output were to become disconnected from the control input, the magnitude of the lamp current would be larger than said certain desirable magnitude.

7. The arrangement of claim 4 wherein the conditioning circuit is further characterized by including an intermittently conducting transistor and an energy-storing capacitor.

8. An arrangement comprising:
an AC source operative to provide an AC source voltage at a pair of AC source terminals;
a conditioning circuit connected with the AC source terminals and operative to provide a DC supply voltage at a pair of DC output terminals; the conditioning circuit being characterized by: (i) including a pre-converter circuit having an intermittently charged energy-storing inductor and a control input, and (ii) causing the magnitude of the DC supply voltage to be regulated to a certain maximum level except when receiving a control signal at the control input; and
a ballast circuit having a pair of DC input terminals connected with the DC output terminals and being operative to provide an AC output voltage from a set of AC output terminals; the AC output terminals being adapted to connect with and, when indeed so connected, to provide lamp current to a gas discharge lamp; the ballast circuit having a control output operative, in response to the flow of lamp current, to provide a signal in the event the magnitude of the lamp current were to exceed a desired level by even a small amount; the control output being connected with the control input, thereby (i) to provide the control signal to the control input whenever the magnitude of the lamp current exceeds the desired level by such a small amount, and (ii) to prevent the magnitude of the lamp current from exceeding the desired level by anything more than such a small amount.

9. The arrangement of claim 8 wherein, in case the connection between the control output and the control input were to be broken, the magnitude of the lamp current would exceed the desired level by more than such a small amount.

10. The arrangement of claim 8 wherein, whenever the gas discharge lamp is not connected with the AC output terminals, the magnitude of the DC supply voltage is regulated to remain at or near said certain maximum level substantially regardless of changes in the magnitude of the AC source voltage.

11. The arrangement of claim 8 wherein the provision of the control signal serves to cause the magnitude of the DC supply voltage to decrease to a level below said certain maximum level.

12. An arrangement comprising:
an AC source operative to provide an AC source voltage at a pair of AC source terminals;
a conditioning circuit connected with the AC source terminals and operative to provide a DC supply voltage at a pair of DC output terminals; the conditioning circuit being characterized by: (i) including a pre-converter circuit having an intermittently charged energy-storing inductor and a control input; and (ii) substantially regardless of changes in the magnitude of the AC source voltage, causing the magnitude of the DC supply voltage to be regulated to a certain level except when receiving a control signal at the control input; and a ballast circuit having a pair of DC input terminals connected with the DC output terminals and being operative to provide an AC output voltage from a set of AC output terminals; the AC output terminals being adapted to connect with and, when indeed so connected, to provide lamp current to a gas discharge lamp; the ballast circuit having a control output operative, in response to the flow of lamp current, to provide a signal representative of the magnitude of the lamp current; the control output being connected with the control input, thereby to provide the control signal to the control input such as to cause the the magnitude of the DC supply voltage to be adjusted in such manner as to regulate the magnitude of the lamp current to a pre-determined level;

whereby: (a) when the lamp is not connected with the AC output terminals, the magnitude of the DC supply voltage is regulated to said certain level; and (b) when the lamp is connected with the AC output terminals, the magnitude of the lamp current is regulated to the pre-determined level by way of adjusting the magnitude of the DC supply voltage away from said certain level.

13. The arrangement of claim 12 wherein the AC source is an ordinary electric utility power line.

14. The arrangement of claim 12 wherein the lamp current is of a fundamental frequency substantially different from that of the AC source voltage.

15. An arrangement comprising:
a source operative to provide an ordinary power line voltage at a pair of power line terminals; and
a frequency-converting ballast circuit connected with the power line terminals and characterized by: (i) including components the characteristics of which may fail to exactly meet certain specifications; (ii) having a pair of DC terminals across which is provided a DC voltage; (iii) having a pair of AC terminals adapted to connect with a gas discharge lamp, thereby to cause a lamp current to flow therethrough; (iv) causing the magnitude of the lamp current to be affected by any failure to exactly meet said certain specifications; (v) causing the magnitude of the lamp current to be proportional to the magnitude of the DC voltage; (vi) whenever the lamp is indeed connected with the AC terminals, causing the magnitude of the lamp current to be regulated to a desired current level substantially regardless of any failure to meet said certain specifications; and (vii) whenever the lamp is not connected with the AC terminals, causing the magnitude of the DC voltage to be regulated to a certain substantially constant level regardless of changes in the magnitude of the power line voltage;

whereby: (a) when the lamp is not connected with the AC terminals, the magnitude of the DC voltage is regulated to said certain substantially constant level substantially irrespective of changes in the magnitude of the power line voltage; and (b) when the lamp is in fact connected with the AC terminals, the magnitude of the lamp current is regulated to the pre-determined level by way of adjusting the magnitude of the DC voltage away from said certain substantially constant level, thereby to compensate for any failure to exactly meet said specifications.

16. An arrangement comprising:
an AC source operative to provide an AC source voltage at a pair of AC source terminals;
a conditioning circuit connected with the AC source terminals and operative to provide a DC voltage at a pair of DC output terminals; the conditioning circuit being characterized by: (i) including a pre-converter circuit having an intermittently charged energy-storing inductor and a control input; and (ii) substantially regardless of changes in the magnitude of the AC source voltage, causing the magnitude of the DC voltage to be regulated to a certain level except when receiving a control signal at the control input; and
a ballast circuit having a pair of DC input terminals connected with the DC output terminals and being operative to provide an AC output voltage from a set of AC output terminals; the AC output terminals being adapted to connect with and, when indeed so connected, to provide lamp current to a gas discharge lamp; the ballast circuit having a control output operative, in response to the flow of lamp current, to provide a signal representative of the magnitude of the lamp current; the control output being connected with the control input, thereby to provide the control signal to the control input such as to cause the the magnitude of the DC voltage to be reduced in response to the flow of lamp current in excess of a pre-determined level;
such that: (a) when the lamp is not connected with the AC output terminals, the magnitude of the DC voltage is regulated to said certain level; and (b) when the lamp is connected with the AC output terminals, the magnitude of the DC voltage is regulated to a level lower than said certain level.

17. An arrangement comprising:
an AC source operative to provide an AC source voltage at a pair of AC source terminals;
a conditioning circuit connected with the AC source terminals and operative to provide a DC voltage at a pair of DC output terminals; the conditioning circuit being characterized by, substantially regardless of changes in the magnitude of the AC source voltage, causing the magnitude of the DC voltage to be regulated to a certain level except when receiving a control signal at a control input; and
a ballast circuit having a pair of DC input terminals connected with the DC output terminals and being operative to provide an AC output voltage from a set of AC output terminals; the AC output terminals being adapted to connect with and, when indeed so connected, to provide lamp current to a gas discharge lamp; the ballast circuit having a control output operative, in response to the flow of lamp current, to provide a signal representative of the magnitude of the lamp current; the control output being connected with the control input, thereby to provide the control signal to the control input such as to cause the the magnitude of the DC voltage to be reduced in response to the flow of lamp current in excess of a pre-determined level;

such that: (a) when the lamp is not connected with the AC output terminals, the magnitude of the DC voltage is regulated to said certain level; and (b) when the lamp is connected with the AC output terminals, the magnitude of the DC voltage is regulated to a level lower than said certain level.

18. An arrangement comprising:

an AC source operative to provide an AC source voltage at a pair of AC source terminals;

a conditioning circuit operable to be connected with the AC source terminals and functional, after indeed having been connected with the AC source terminals, to provide a DC supply voltage at a pair of DC output terminals; the conditioning circuit being characterized by (i) immediately after having been connected with the AC source terminals, causing the magnitude of the DC supply voltage to assume a certain relatively high level, and (ii) subsequently, in response to a control action received at a control input, to assume a relatively low level; the relatively high level being substantially higher than the relatively low level; and a ballast circuit having a pair of DC input terminals connected with the DC output terminals and being operative to provide an AC output voltage from a set of AC output terminals; the AC output terminals being connected with a gas discharge lamp.

19. The arrangement of claim 18 wherein the ballast circuit has a control output connected with the control input; the control output being functional to provide said control action.

20. The arrangement of claim 19 wherein the control output provides said control action a short period after the conditioning circuit has been connected with the AC source terminals.

* * * * *